US012588406B2

(12) United States Patent
Chen et al.

(10) Patent No.: US 12,588,406 B2
(45) Date of Patent: Mar. 24, 2026

(54) QUANTUM DOT LIGAND, QUANTUM DOT-LIGAND SYSTEM AND QUANTUM DOT MATERIAL

(71) Applicants: Beijing BOE Technology Development Co., Ltd., Beijing (CN); BOE Technology Group Co., Ltd., Beijing (CN)

(72) Inventors: Zhuo Chen, Beijing (CN); Wenhai Mei, Beijing (CN); Zhuo Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 779 days.

(21) Appl. No.: 17/918,568

(22) PCT Filed: Sep. 29, 2021

(86) PCT No.: PCT/CN2021/121925
§ 371 (c)(1),
(2) Date: Oct. 13, 2022

(87) PCT Pub. No.: WO2023/050214
PCT Pub. Date: Apr. 6, 2023

(65) Prior Publication Data

US 2024/0244954 A1 Jul. 18, 2024

(51) Int. Cl.
*H10K 85/30* (2023.01)
*C07F 19/00* (2006.01)
(Continued)

(52) U.S. Cl.
CPC ......... *H10K 85/381* (2023.02); *C07F 19/005* (2013.01); *C09K 11/025* (2013.01);
(Continued)

(58) Field of Classification Search
CPC .... H10H 20/80; H10H 20/851; H10K 50/115; H10K 59/35; H10K 71/13; H10K 85/30;
(Continued)

(56) References Cited

U.S. PATENT DOCUMENTS

| | | | |
|---|---|---|---|
| 2,856,369 | A | 10/1958 | Smith et al. |
| 6,696,540 | B2 | 2/2004 | Okubo et al. |

(Continued)

FOREIGN PATENT DOCUMENTS

| | | | |
|---|---|---|---|
| AU | 2002301989 | B2 | 4/2004 |
| CA | 2406303 | A1 | 5/2003 |

(Continued)

OTHER PUBLICATIONS

William H. Garcia Santos et al., "Gd(OTf)3-Catalyzed the Synthesis of Geranyl Esters for the Intramolecular Radical Cyclization of their Epoxides Mediated by Titanocene(III)", Organic & Biomolecular Chemistry, 5, vol. 13, Nov. 18, 2014, 69 pages.

(Continued)

*Primary Examiner* — Brook Kebede
(74) *Attorney, Agent, or Firm* — XSENSUS LLP

(57) ABSTRACT

The present disclosure provides a quantum dot ligand, a quantum dot-ligand system and a quantum dot material, belonging to the field of display technology. The quantum dot ligand includes an X group, a Y group and a Z group. The Y group is configured to provide at least two binding sites, among which at least one binding site is configured to bind with the X group, and the remaining binding site is configured to bind with the Z group. The X group is a coordination group configured to form a coordination bond with a surface of a quantum dot. The Z group is a saturated 3- to 5-membered heterocyclic group containing O or S.

16 Claims, 1 Drawing Sheet

(51) Int. Cl.

| | |
|---|---|
| ***C09K 11/02*** | (2006.01) |
| ***C09K 11/88*** | (2006.01) |
| ***H10K 71/13*** | (2023.01) |
| *B82Y 20/00* | (2011.01) |
| *B82Y 40/00* | (2011.01) |
| *H10K 50/115* | (2023.01) |
| *H10K 59/35* | (2023.01) |

(52) U.S. Cl.

CPC ............ *C09K 11/883* (2013.01); *H10K 71/13* (2023.02); *B82Y 20/00* (2013.01); *B82Y 40/00* (2013.01); *H10K 50/115* (2023.02); *H10K 59/35* (2023.02)

(58) Field of Classification Search

CPC ...... H10K 85/381; B82Y 20/00; B82Y 40/00; C07F 19/00; C07F 19/005; C09K 11/025; C09K 11/02; C09K 11/88; C09K 11/883

See application file for complete search history.

(56) References Cited

U.S. PATENT DOCUMENTS

| | | | | |
|---|---|---|---|---|
| 9,487,614 | B2 | 11/2016 | Matmour et al. | |
| 11,171,300 | B2 | 11/2021 | Yu | |
| 2003/0144431 | A1 | 7/2003 | Okubo et al. | |
| 2010/0324017 | A1 | 12/2010 | Kinoyama et al. | |
| 2015/0299367 | A1 | 10/2015 | Matmour et al. | |
| 2020/0075877 | A1 | 3/2020 | Yu | |
| 2020/0127219 | A1 | 4/2020 | Chen et al. | |
| 2021/0098655 | A1 | 4/2021 | Anc et al. | |
| 2022/0135873 | A1* | 5/2022 | Gerlitzki | C09K 11/025 252/301.36 |
| 2023/0140861 | A1* | 5/2023 | Chen | C07C 323/16 252/301.36 |

FOREIGN PATENT DOCUMENTS

| | | | |
|---|---|---|---|
| CA | 2677995 | A1 | 8/2008 |
| CN | 1421445 | A | 6/2003 |
| CN | 101627013 | A | 1/2010 |
| CN | 104870480 | A | 8/2015 |
| CN | 106957645 | A | 7/2017 |
| CN | 107102514 | A | 8/2017 |
| CN | 108550707 | A | 9/2018 |
| CN | 109378395 | A | 2/2019 |
| CN | 110467918 | A | 11/2019 |
| CN | 106957645 | B | 12/2019 |
| CN | 111218222 | A | 6/2020 |
| CN | 111548785 | A | 8/2020 |
| CN | 111686814 | A | 9/2020 |
| CN | 112234149 | A | 1/2021 |
| CN | 112234154 | A | 1/2021 |
| CN | 112239664 | A | 1/2021 |
| CN | 112271269 | A | 1/2021 |
| CN | 107102514 | B | 3/2021 |
| CN | 112823433 | A | 5/2021 |
| CN | 113292463 | A | 8/2021 |
| EP | 1316555 | A1 | 6/2003 |
| EP | 1316555 | B1 | 2/2005 |
| EP | 2119704 | A1 | 11/2009 |
| JP | 2005070318 | A | 3/2005 |
| JP | 2010195905 | A | 9/2010 |
| KR | 20050020722 | A | 3/2005 |
| TW | 200513670 | A | 4/2005 |
| WO | 2021051279 | A1 | 3/2021 |
| WO | 2021058464 | A1 | 4/2021 |
| WO | 2021164768 | A1 | 8/2021 |

OTHER PUBLICATIONS

Xiaojuan Dong et al., "Electrochemical Oxidative Dehydrogenative Phosphorylation of N—Heterocycles with P(O)—H Compounds in Imidazolium-Based Ionic Liquid", Organic Letters 2020, 22, vol. 8, pp. 3062-3066, Apr. 7, 2020, 8 pages.
RN876504-10-8, Mar. 12, 2006, 1 page.
RN2169369-58-6, Jan. 4, 2018, 1 page.
RN2168137-21-9, Jan. 2, 2018, 1 page.
RN2167923-23-9, Jan. 2, 2018, 1 page.
RN1345469-79-5, Nov. 16, 2011, 1 page.
Written Opinion issued Dec. 22, 2021 in PCT/CN2021/121925, 5 pages.

* cited by examiner

QUANTUM DOT LIGAND, QUANTUM DOT-LIGAND SYSTEM AND QUANTUM DOT MATERIAL

CROSS-REFERENCE TO RELATED APPLICATION

The present application is based on PCT filing PCT/CN2021/121925, filed Sep. 29, 2021, the entire contents of which are incorporated herein by reference.

TECHNICAL FIELD

The present disclosure relates to the field of display technology, and in particular, to a quantum dot ligand, a quantum dot-ligand system and a quantum dot material.

BACKGROUND

With the in-depth development of the preparation technology of quantum dots, the stability and luminous efficiency of quantum dots are continuously improved. The research on quantum dot light emitting diodes (QLEDs) is continuously deepened, and the application prospect of QLEDs in the display field is becoming increasingly bright. However, the efficiency of QLEDs has not yet reached the level of mass production. One of the important reasons is that the high resolution patterning technology of QLEDs has not yet made a breakthrough.

The inorganic nano-particle characteristics of quantum dots make it impossible to form and pattern a film through evaporation, and it is difficult to achieve high resolution by inkjet printing.

The above information disclosed in the "BACKGROUND" section is only used to enhance the understanding of the background of the present disclosure, so it may include information that does not constitute the prior art known to those of ordinary skill in the art.

SUMMARY

The purpose of the present disclosure is to provide a quantum dot ligand, a quantum dot-ligand system and a quantum dot material. The present disclosure adopts the following technical solutions.

According to a first aspect of the present disclosure, a quantum dot ligand is provided, including an X group, a Y group and a Z group.

The Y group is configured to provide at least two binding sites, among which at least one binding site is configured to bind with the X group, and a remaining binding site other than the at least one binding site is configured to bind with the Z group.

The X group is a coordination group configured to form a coordination bond with a surface of a quantum dot.

The Z group is a saturated 3- to 5-membered heterocyclic group containing O or S.

According to a second aspect of the present disclosure, a quantum dot-ligand system is provided, including a quantum dot, a photo acid generator and the quantum dot ligand described in the first aspect.

According to a third aspect of the present disclosure, a quantum dot-ligand material is provided, including at least two quantum dot-ligand units that include a quantum dot and the quantum dot ligand described in the first aspect. The at least two quantum dot-ligand units form a mesh structure by mutual bonding and cross-linking through ring-opening of the Z group.

According to a fourth aspect of the present disclosure, a method for preparing a quantum dot film layer is provided, including: providing a quantum dot-ligand solution, which is a mixed solution including quantum dots, a photo acid generator and the quantum dot ligands as described in the first aspect; coating the quantum dot-ligand solution on a substrate and performing an exposure treatment, so that the photo acid generator generates hydrogen ions and catalyzes ring-opening of the Z group for cross-linking reaction; and performing a development process to form the quantum dot film layer.

According to a fifth aspect of the present disclosure, a quantum dot light emitting device is provided, including an anode, a cathode and a functional layer between the anode and the cathode. The functional layer includes a quantum dot light emitting layer, and the quantum dot light emitting layer includes the quantum dot-ligand material as described in the third aspect.

According to a sixth aspect of the present disclosure, a method for preparing a quantum dot light emitting device is provided, including: providing a green quantum dot-ligand solution, which is a mixed solution including green quantum dots, a photo acid generator and the quantum dot ligands as described in the first aspect; providing a blue quantum dot-ligand solution, which is a mixed solution including blue quantum dots, a photo acid generator and the quantum dot ligands as described in the first aspect; providing a red quantum dot-ligand solution, which is a mixed solution including red quantum dots, a photo acid generator and the quantum dot ligands as described in the first aspect; coating the green quantum dot-ligand solution on a substrate, and performing an exposure and development, to form green sub pixels; coating the blue quantum dot-ligand solution on the substrate, and performing an exposure and development, to form blue sub pixels; coating the red quantum dot-ligand solution on the substrate, and performing an exposure and development, to form red sub pixels.

According to a seventh aspect of the present disclosure, a display device is provided, including the quantum dot light emitting device as described in the fifth aspect.

BRIEF DESCRIPTION OF THE DRAWINGS

The above and other features and advantages of the present disclosure will become more apparent by describing the exemplary embodiments thereof in detail with reference to the accompanying drawings.

DETAILED DESCRIPTION

Figure 1:
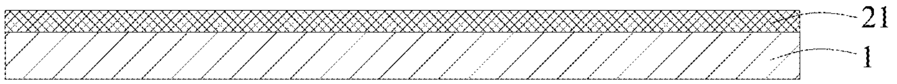
FIG. 1 is a schematic structural diagram of a substrate after coating a green-quantum dot ligand solution on it in some exemplary embodiments of the present disclosure.

Exemplary embodiments will now be described more fully with reference to the accompanying drawings. However, the exemplary embodiments can be implemented in various forms, and should not be construed as limited to the examples set forth herein. On the contrary, providing these embodiments will make the present disclosure more comprehensive and complete, and will comprehensively convey the concept of the exemplary embodiments to those skilled in the art. The described features, structures, or characteristics may be combined in one or more embodiments in any suitable manner. In the following description, many specific details are provided to give a full understanding of the embodiments of the present disclosure.

In the accompanying drawings, the thickness of regions and layers may be exaggerated for clarity. The same reference number in the accompanying drawings represents the same or similar structures, and thus their detailed description will be omitted.

The described features, structures, or characteristics may be combined in one or more embodiments in any suitable manner. In the following description, many specific details are provided to give a full understanding of the embodiments of the present disclosure. However, those skilled in the art will realize that the technical solution of the present disclosure can be practiced without one or more of the specific details, or other methods, components, materials, etc. can be adopted. In other cases, well-known structures, materials or operations are not shown or described in detail to avoid blurring the main technical ideas of the present disclosure.

When a certain structure is "on" other structures, it may mean that the certain structure is integrally formed on other structures, or that the certain structure is "directly" provided on other structures, or that the certain structure is "indirectly" provided on other structures through another structure.

The terms "a", "an" and "the" are used to indicate the presence of one or more elements/components/etc. The terms "including" and "having" are used to indicate an open-ended inclusive meaning and mean that there may be additional elements/components/etc., in addition to the listed elements/components/etc. The terms "first" and "second" etc., are used only as marks and are not intended to limit the number of their objects.

Quantum dots (QDs) consist of atoms of zinc, cadmium, selenium and sulfur, which are nano-materials with a crystal diameter ranging from 2 nm to 10 nm, and have unique photoelectric characteristics. After being stimulated by photoelectricity, they will emit pure monochromatic light of various colors according to the diameter of the quantum dots, which can change the color of the light source.

In the related art, quantum dots cannot be vaporized in the same way as self-luminous OLEDs due to their disadvantages of being easily affected by heat and moisture, and currently they can only be printed by inkjet printing. However, it is difficult to achieve high resolution through inkjet printing.

The present disclosure provides a quantum dot ligand, and a quantum dot-ligand system containing the quantum dot ligand. The system has photosensitive characteristics, and can directly form red, green, and blue sub-pixels through a photolithography process, avoiding the technical difficulty similar to inkjet printing to improve resolution, such as the need for higher precision print heads, etc. The quantum dot ligands provided by the present disclosure help to realize the production of high-resolution QLED products, facilitating the preparation of the process, improving the yield of the process, and greatly improving the utilization rate of the quantum dot material, thus providing a basis for the large-scale industrialization of QLED.

The present disclosure provides a quantum dot ligand, including an X group, a Y group and a Z group.

The Y group is configured to provide at least two binding sites, among which at least one binding site is configured to bind with the X group, and the remaining one or more binding sites are configured to bind with the Z group.

The X group is a coordination group configured to form a coordination bond with a surface of a quantum dot.

The Z group is a saturated 3- to 5-membered heterocyclic group containing O or S.

The quantum dot ligand provided by the present disclosure includes the coordination group and the saturated 3- to 5-membered heterocyclic group containing O or S. The coordination group can form the coordination bond with the quantum dot, thus forming a quantum dot-ligand unit. The saturated 3- to 5-membered heterocyclic group containing O or S can undergo a ring-opening reaction with the assistance of the photo acid generator, causing the quantum dot-ligand units being cross-linked with each other, thus providing a basis for the formation of a quantum dot film layer by adopting a photolithography process.

Quantum dots (QDs), synthesized by solution method, are inorganic semiconductor nano-particles with sizes ranging from 1-10 nm, and the size is close to or smaller than the exciton Bohr radius of the particles. Quantum dots are easy to agglomerate due to their small size and large specific surface area and have many surface defects. Therefore, the surface of quantum dots is usually cladded with organic surface ligands during application. The organic surface ligands not only protect the quantum dots but also make the quantum dots have good solubility in solution. The migration of carriers (electrons and holes) in the quantum dots is confined inside the quantum dots, which makes the quantum dots have unique optical and electrical properties. Due to the unique size dependent properties, the light absorption and luminescence properties of the quantum dots can be easily adjusted by controlling the particle size, shape or surface structure.

The surface of the quantum dots is usually cladded with a layer of organic ligands. These surface ligands not only determine the solubility and surface chemical functionality of the quantum dots, but also greatly affect the fluorescence quantum yield and electrical property of the quantum dots.

In the present disclosure, the binding site refers to where some groups provide a chemical bond that may be used to bind with other groups. The Y group may have two or more binding sites, and different binding sites may be bound with different groups.

The Y group is configured to provide at least two binding sites, among which at least one binding site is configured to bind with the X group, and the remaining one or more binding sites are configured to bind with the Z group. In this expression, the binding site is configured to bind with the X group or the Z group. Specifically, the binding site may be directly bound with the X group or the Z group, or indirectly bound with the X group or the Z group through an intermediate group. When there are multiple binding sites bound with the X group, the number of the X group in the quantum dot ligand structure is multiple. Similarly, when there are multiple binding sites bound with the Z group, the number of the Z group in the quantum dot ligand structure is multiple. The X group and the Z group are the terminal groups of the quantum dot ligand structure.

The coordination group is bound with the surface of the quantum dot through the coordination bond, thereby introducing the quantum dot ligand of the present disclosure to the quantum dot.

The Z group is a saturated 3- to 5-membered heterocyclic group containing O or S. Specifically, the Z group may be a saturated 3-membered heterocyclic group, a saturated 4-membered heterocyclic group or a saturated 5-membered heterocyclic group.

In some embodiments of the present disclosure, the Z group is a photosensitive group, and the Z group in the quantum dot ligand is configured to undergo a cross-linking reaction with an adjacent quantum dot ligand by ring-opening under an external action.

In some embodiments of the present disclosure, the Y group includes at least one binding group, and the binding group provides at least two binding sites. Among the binding sites of the at least one binding group, one binding site is configured to bind with the Z group. The at least one binding group is selected from alkylene with a carbon atom number ranging from 2 to 12.

The Y group may include one or more binding groups. When the Y group contains only one binding group, the binding group has two binding sites, one of which is configured to bind with the coordination group (i.e., the X group), and the other binding site is configured to bind with the Z group.

When the Y group contains multiple binding groups, the multiple binding groups may be the same or different. One of the binding sites of these binding groups is configured to bind with the Z group, and the other binding sites are configured to bind with the X group or other binding groups. In addition, at least one binding site of at least one binding group among the binding groups is configured to bind with the X group. For example, when the Y group contains multiple binding groups, one of the binding groups may be taken as a parent chain and the other binding groups may be taken as branched chains. The binding group of the parent chain has multiple binding sites, among which at least one binding site is configured to bind with the X group, at least one binding site is configured to bind with the Z group, and the remaining binding sites are configured to bind with the binding groups of branched chains. The binding groups of the branched chains may have two binding sites. One binding site of the binding groups of the branched chains is configured to bind with the binding group of the parent chain, and the other binding site is configured to bind with the Z group. In this case, the Y group formed by the binding of the multiple binding groups appears as dendrimer with branches.

The binding group is selected from alkylene with a carbon atom number ranging from 2 to 12. Specifically, the carbon atom number of the alkylene may be 2, 3, 4, 5, 6, 7, 8, 9, 10, 11 or 12. The alkylene may be straight chain alkylene or branched alkylene, such as ethyl, n-propyl, isopropyl, n-butyl, isobutyl, sec-butyl, tert-butyl, amyl, hexyl, heptyl, octyl, etc.

In some embodiments of the present disclosure, the Y group further includes a carrier transport regulating group bound between the binding group and the Z group. The carrier transport regulating group is provided in the quantum dot ligand, so as to form a quantum dot-ligand material with strong carrier transport capability subsequently.

The carrier transport regulating group is selected from an aniline structure, a triphenylamine structure or a carbazole structure. Among them, the triphenylamine structure and the carbazole structure are favorable for hole transport.

In some embodiments of the disclosure, the Y group further includes a dissolving group bound between the binding group and the Z group and selected from a structure containing

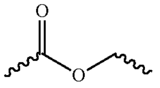

or

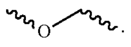

When the Y group includes the carrier transport regulating group, the dissolving group may be bound between the binding group and the carrier transport regulating group, or between the carrier transport regulating group and the Z group (photosensitive group). Providing the dissolving group in the quantum dot ligand of the present disclosure is helpful to the synthesis of the quantum dot ligand on the one hand, and also is helpful to increase the solubility of the quantum dot ligand on the other hand.

In some embodiments of the present disclosure, the coordination group is selected from an amino group, a carboxylic acid group, a sulfydryl, a phosphine group, a phosphine oxide group, or a saturated heterocyclic group containing a disulfide bond. Among them, the saturated heterocyclic group containing a disulfide bond may a saturated five membered ring or a six membered ring. For example, when the coordination group is selected from the sulfydryl, the S atom in the sulfydryl forms a coordination bond with the surface of the ZnSe/CdSe quantum dot. When the coordination group is selected from the amino group, the N atom in the amino group forms a coordination bond with the surface of the ZnSe/CdSe quantum dot. When the coordination group is selected from the saturated heterocyclic group containing a disulfide bond, the disulfide bond is broken, and the S atom in it forms a coordination bond with the surface of the ZnSe/CdSe quantum dot.

In some embodiments of the present disclosure, the Z group is preferably an epoxy group. The epoxy group is a three membered ring, which is easy to synthesize and has a fast ring-opening polymerization rate without heating.

In some embodiments of the present disclosure, the quantum dot ligand is selected from a group consisting of the following structures:

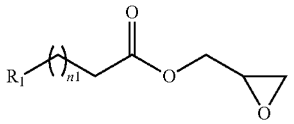

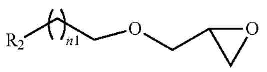

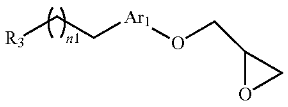

-continued

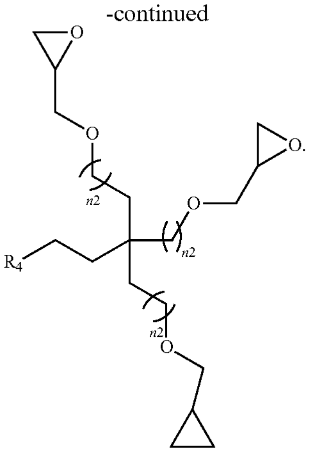

$R_1$, $R_2$, $R_3$ and $R_4$ are each independently selected from an amino group, a carboxylic acid group, a sulfydryl, a phosphine group, a phosphine oxide group or

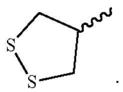

.

$Ar_1$ is selected from a structure containing phenyleneamido, carbazolyl or

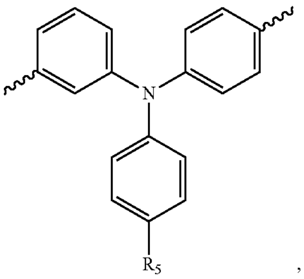

, and $R_5$ is selected from

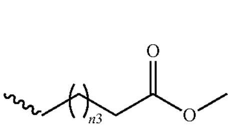

or

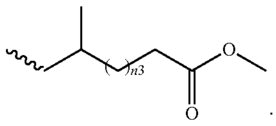

.

$n_1$, $n_2$, and $n_3$ are each independently selected from any integer ranging from 2 to 8.

In this embodiment, the triphenylamine group has strong rigidity, resulting in poor solubility, while R5 group has strong solubility, and binding R5 with the triphenylamine group helps to improve the solubility of the triphenylamine structure.

In the present disclosure, the adopted way of description "be each independently selected from" is broadly understood, which can mean that in different groups, the specific options expressed between the same symbols do not affect each other, or that in the same group, the specific options expressed between the same symbols do not affect each other.

In some embodiments of the present disclosure, the quantum dot ligand is selected from a group consisting of the following structures:

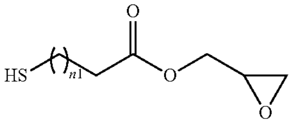

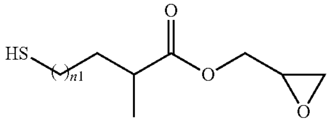

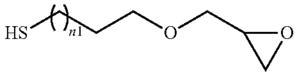

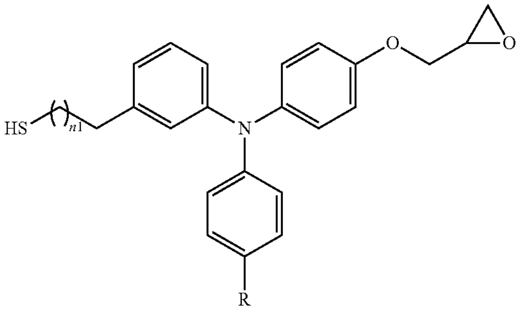

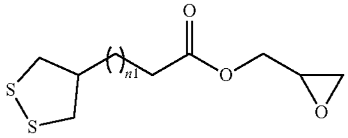

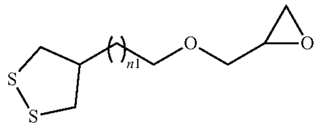

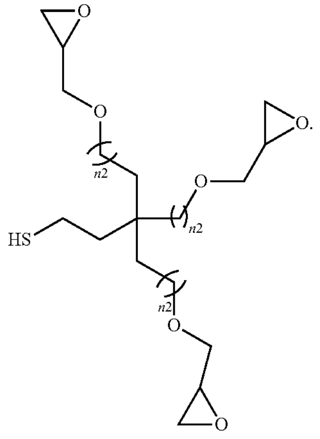

R is selected from

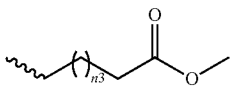

or

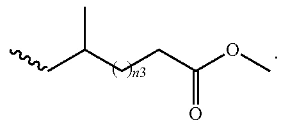

.

$n_1$, $n_2$, and $n_3$ are each independently selected from any integer ranging from 2 to 8.

In the present disclosure, the epoxy group has sufficient solubility in the medium to high polar solvent such as PGMEA (propylene glycol methyl ether acetate). Therefore, the epoxy group in the present disclosure can in addition to be used as a photosensitive group as well as a dissolving group, which is bound with a structure containing

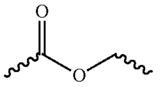

or

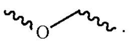

This can jointly enhance the solubility of the quantum dot ligand while ensuring that the quantum dot ligand of the present disclosure have photosensitive properties.

The present disclosure further provides a quantum dot-ligand system, including a quantum dot, a photo acid generator and the quantum dot ligand as described above.

The inorganic part of the quantum dot in the present disclosure includes, but is not limited to, a quantum dot such as CdS, CdSe, ZnSe, InP, PbS, $CsPbCl_3$, $CsPbBr_3$, $CsPhI_3$, CdS/ZnS, CdSe/ZnS, ZnSe, InP/ZnS, PbS/ZnS, $CsPbCl_3$/ZnS, $CsPbBr_3$/ZnS, $CsPhI_3$/ZnS, ZnSe, ZnTeSe/ZnSe; and also includes ZnO, ZnMgO, ZnALO, ZnLiO and other nano-particle materials.

The photo acid generator is a kind of photosensitive compound, which decomposes under light to produce acids (H+). The photo acid generator is selected from sulfonium and onium salts, triazines, sulfonic esters or diazonium salts. Specifically, the photo acid generator is selected from hexafluoroantimonate triphenyl sulfonium and onium salts, (4,6)-bis (trichloromethyl)-1,3,5 triazine derivatives, N-p-toluenesulfonyloxy phthalimide, diazo fluoroborate.

In this quantum dot-ligand system, quantum dots and quantum dot ligands can be bound by coordination bonds to form quantum dot-ligand units. The photo acid generator can be decomposed under light to produce acid (H+), which promotes the ring-opening of saturated heterocyclic group containing O or S in the quantum dot-ligand units, and the cross-linking between quantum dot-ligand units.

The present disclosure further provides a quantum dot-ligand material, including at least two quantum dot-ligand units. The quantum dot-ligand unit includes a quantum dot and the quantum dot ligand as described above. The quantum dot-ligand units form a mesh structure between each other by mutually bonding and cross-linking through the ring-opening of the Z group.

The present disclosure further provides a method for preparing a quantum dot film layer, including following steps.

A quantum dot-ligand solution is provided. The quantum dot-ligand solution is a mixed solution including quantum dots, a photo acid generator and the quantum dot ligands as described above.

The quantum dot-ligand solution is coated on a substrate, and an exposure treatment is performed, so that the photo acid generator generates hydrogen ions and catalyzes ring-opening of the Z group for cross-linking reaction.

A development is performed to form the quantum dot film layer.

The present disclosure further provides a quantum dot light emitting device, including an anode, a cathode and a functional layer between the anode and the cathode. The functional layer includes a quantum dot light emitting layer, and the quantum dot light emitting layer includes the quantum dot-ligand material as described above.

The functional layer further includes a hole injection layer, a hole transport layer, an electron transport layer and an electron injection layer.

In a specific embodiment of the present disclosure, the quantum dot light emitting device may include an anode, a hole transport layer, a quantum dot light emitting layer, an electron transport layer and a cathode that are stacked in sequence.

Optionally, the anode includes the following anode materials, which are preferably materials with a large work function that facilitate hole injection into the functional layer. Specifically, the anode materials include: metals such as nickel, platinum, vanadium, chromium, copper, zinc and gold or alloys thereof; and metal oxides such as zinc oxide, indium oxide, indium tin oxide (ITO) and indium zinc oxide (IZO). Preferably, a transparent electrode containing indium tin oxide (ITO) as an anode is included.

Optionally, the hole transport layer may include one or more hole transport materials, and the hole transport material may be selected from carbazole polymers, carbazole linked triarylamine compounds or other types of compounds, which are not specifically limited in the present disclosure.

The electron transport layer may be a single layer structure or a multi-layer structure, which may include one or more electron transport materials. The electron transport material may be selected from benzimidazole derivatives, oxadiazole derivatives, quinoxaline derivatives or other electron transport materials, which is not specifically limited in the present disclosure.

Optionally, the cathode includes the following cathode materials, which are materials with a small work function that facilitate electron injection into the functional layer. Specifically, the cathode materials include: metals such as magnesium, calcium, sodium, potassium, titanium, indium, yttrium, lithium, gadolinium, aluminum, silver, tin and lead or alloys thereof; or multi-layer materials such as LiF/Al, Liq/Al, $LiO_2$/Al, LiF/Ca, LiF/Al and $BaF_2$/Ca, but not limited thereto.

Optionally, a hole injection layer may further be provided between the anode and the hole transport layer, to enhance the ability to inject holes into the hole transport layer. An electron injection layer may further be provided between the cathode and the electron transfer layer, to enhance the ability of injecting electrons into the electron transfer layer.

The present disclosure further provides a method for preparing a quantum dot light emitting device, including the following steps.

A green quantum dot-ligand solution is provided. The green quantum dot-ligand solution is a mixed solution including green quantum dots, a photo acid generator and the quantum dot ligands as described above.

A blue quantum dot-ligand solution is provided. The blue quantum dot-ligand solution is a mixed solution including blue quantum dots, a photo acid generator and the quantum dot ligands as described above.

A red quantum dot-ligand solution is provided. The red quantum dot-ligand solution is a mixed solution including red quantum dots, a photo acid generator and the quantum dot ligands as described above.

The green quantum dot-ligand solution is coated on a substrate, and an exposure and development are performed, to form green sub pixels.

The blue quantum dot-ligand solution is coated on the substrate, and an exposure and development are performed, to form blue sub pixels.

The red quantum dot-ligand solution is coated on the substrate, and an exposure and development are performed, to form red sub pixels.

The present disclosure further provides a display device, including the quantum dot light emitting device as described above. The display device of the present disclosure may be a mobile phone, a tablet computer, a television and other electronic devices, which will not be listed one by one here.

Examples of Quantum Dot Ligand Synthesis (1) quantum dot ligand

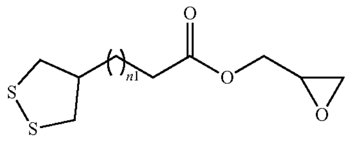

For example, n1=3:

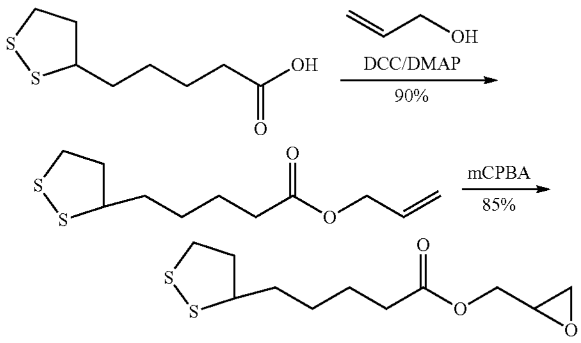

Thioctic acid (CAS 62-46-4; 20.6 g, 100 mmol), prop-2-en-1-ol (CAS 107-18-6; 5.81 g, 100 mmol), 4-dimethylaminopyridine (DMAP, CAS 1122-58-3; 1.22 g, 10 mmol) are dissolved in 100 mL of anhydrous ether, and the system is reduced to 0° C. 1,3-dicyclohexylcarbodiimide (DCC, CAS 538-75-0; 22.7 g, 110 mmol) is dissolved in 50 mL of anhydrous ether, and the former is slowly added at 0° C. After stirring at room temperature overnight, the precipitate was removed by filtration; the filtrate is concentrated under low pressure and purified using a silica gel column to obtain product 1 (22.1 g, 90% yield). $^{1}$H NMR (400 MHZ, CDC13):δ=1.25 (2H), 1.51 (2H), 1.66-1.96 (4H), 2.32-2.34 (3H), 4.69 (1H), 5.31-5.32 (2H), 6.05 (1H)

The product 1 (12.3 g, 50 mmol), 3-chloroperoxybenzoic acid (mCPBA, CAS 937-14-4; 9.49 g, 55 mmol) is dissolved in 200 mL of dichloromethane, and stirred at 0° C. for 2 h, then 1M sodium hydroxide is added to terminate the reaction, and salt water is added for extraction; the organic phase is collected, dried with anhydrous sodium sulfate, separated with a chromatographic column after concentration to obtain a product 2 (11.1 g, 85% yield). $^{1}$H NMR (400 MHZ, CDC13):δ=1.25 (2H), 1.51 (2H), 1.66-1.96 (4H), 2.32-2.34 (3H), 3.13 (1H), 4.07 (1H), 4.32 (1H)

(2) quantum dot ligand

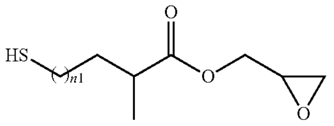

Synthesis by the following synthesis formula:

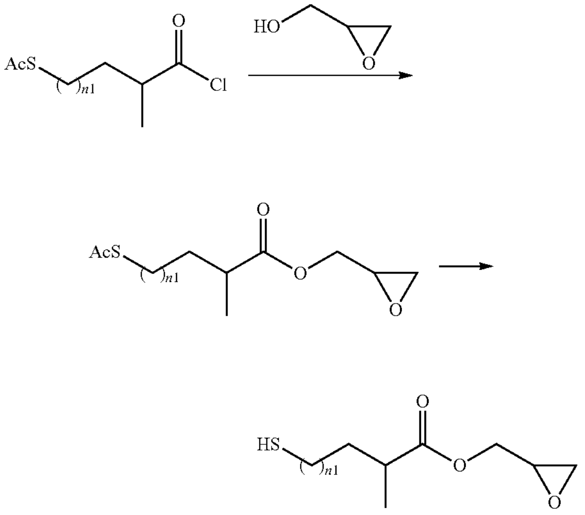

(3) quantum dot ligand

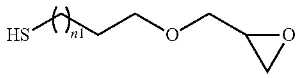

Synthesis by the following synthesis formula:

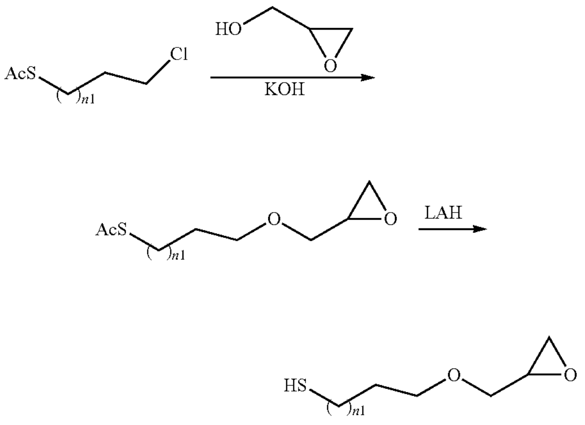

(4) quantum dot ligand

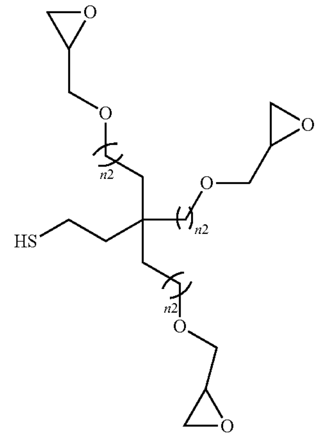

Synthesis by the following synthesis formula:

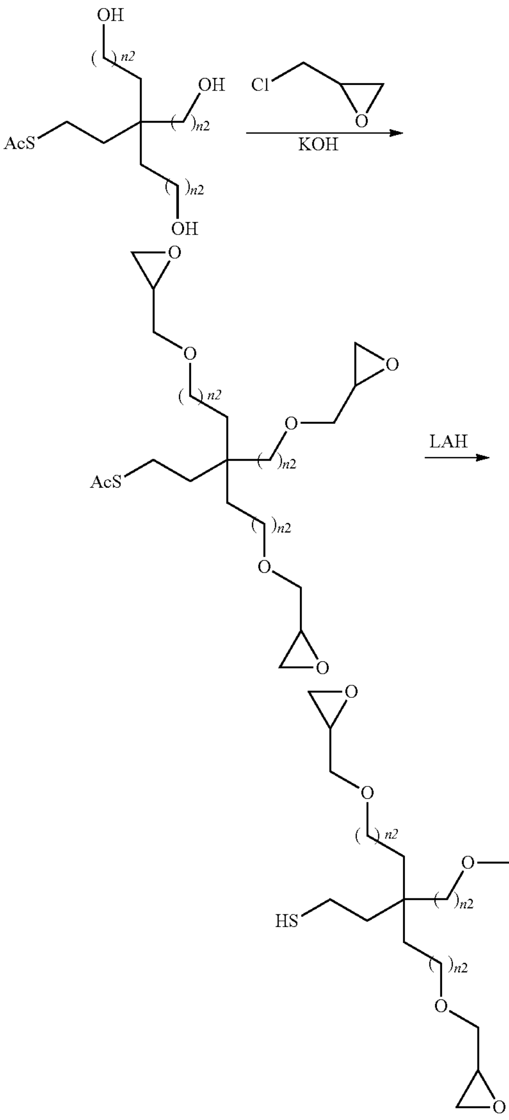

(5) quantum dot ligand

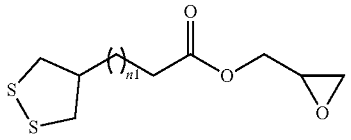

Synthesis by the following synthesis formula:

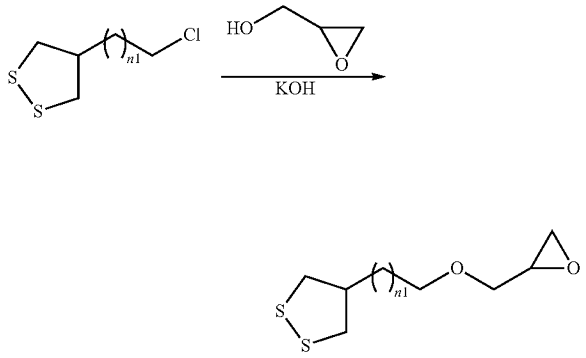

The above quantum dot ligand synthesis formula and synthesis method only exemplify the synthesis method of the quantum dot ligand in the present disclosure, and those skilled in the art can synthesize other quantum dot ligands protected in the present disclosure with reference to the above method.

Formation of a Quantum Dot Film Layer by Photolithography Process (1) A quantum dot-ligand solution is provided, which is a mixed solution including quantum dots, a photo acid generator and quantum dot ligands. The specific steps are as follows.

The quantum dot CdSe/ZnSe of oleic acid ligand is dissolved in a toluene solution, and the quantum dot ligand provided by the present disclosure (the ligand shown in Table 1) is added. After stirring for 4-12 hours, the quantum dots with the quantum dot ligands in the present disclosure are obtained by precipitation/dissolution using ethyl acetate/toluene for 3 times, precipitating using ethyl acetate, drying, and dissolving in toluene, as shown in Table 2.

Then the photo acid generator is added into the solution, with a content of 1%-5% by mass. In this step, a green quantum dot-ligand solution, a blue quantum dot-ligand solution and a red quantum dot-ligand solution can be prepared respectively by controlling the size of the quantum dots.

TABLE 1
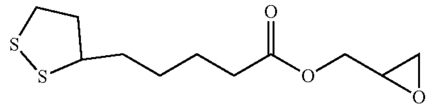 [SMILES: O=C(CCCCC1CCSS1)OCC1CO1]
Ligand 1
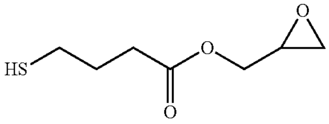 [SMILES: O=C(CCCS)OCC1CO1]
Ligand 2
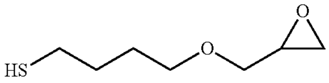
TABLE 1-continued
Ligand 3
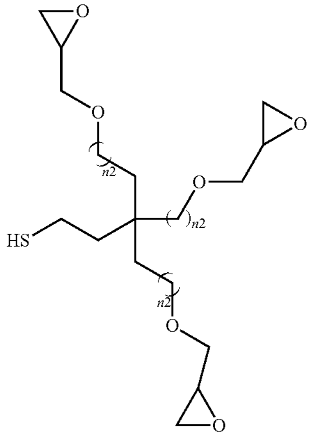
Ligand 4
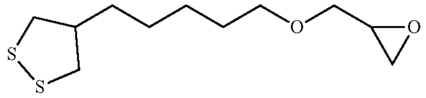 [SMILES: C(CCOCC1CO1)CCC1CSSC1]
Ligand 5
Quantum dots with quantum dot ligands in the present disclosure are as follows:
TABLE 2
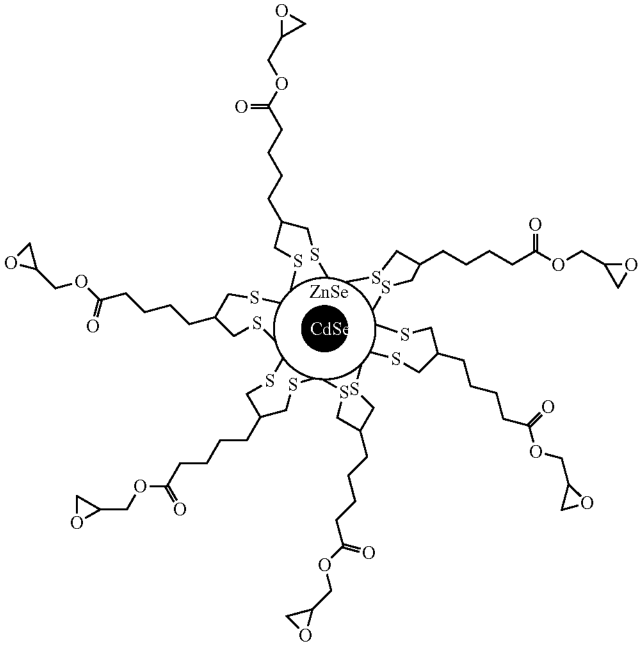

TABLE 2-continued
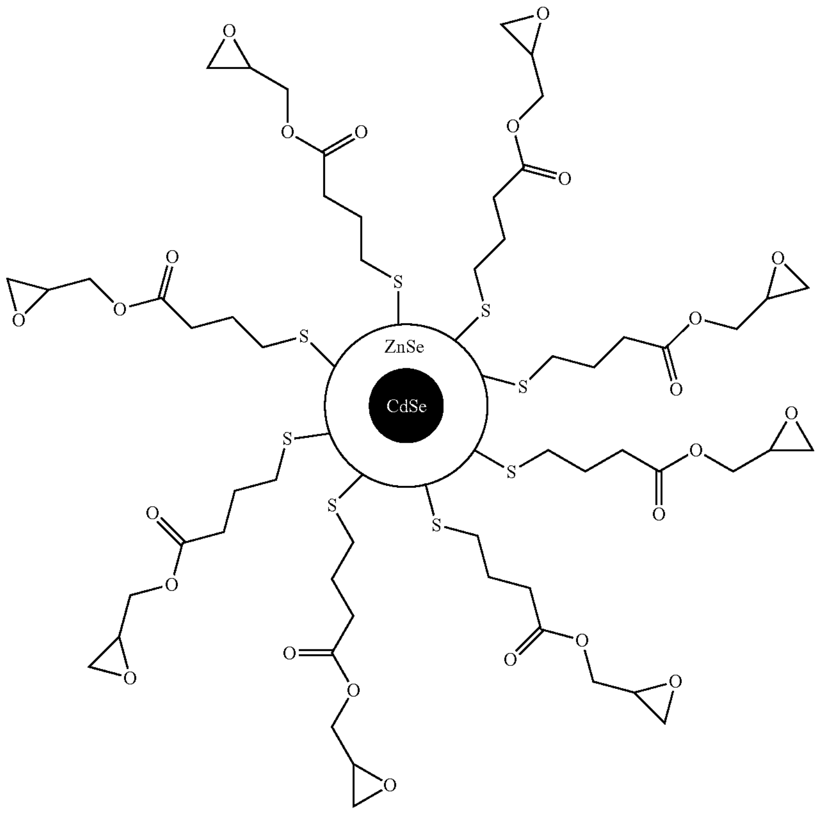
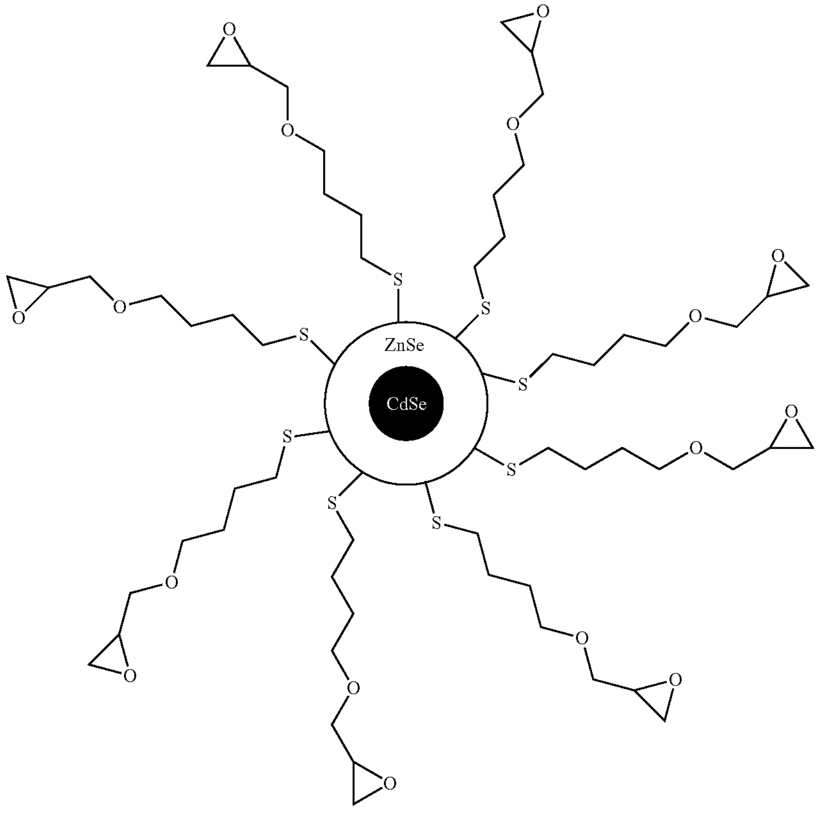

TABLE 2-continued

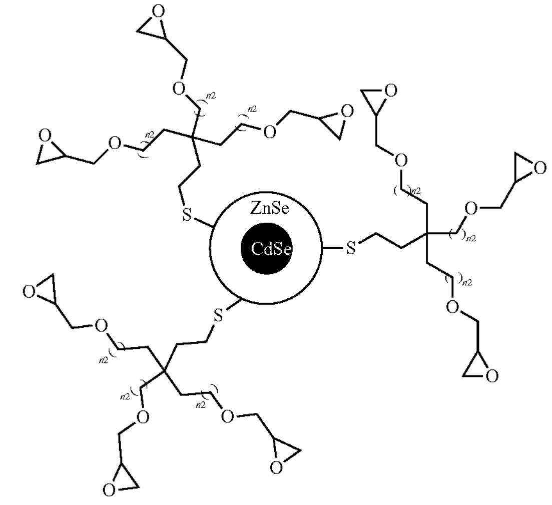

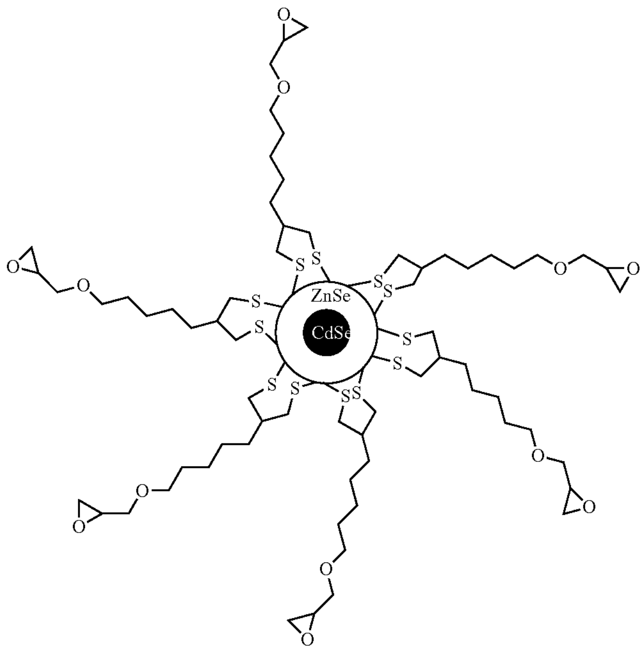

(2) The quantum dot-ligand solution is coated on the substrate for exposure treatment, so that the photo acid generator generates hydrogen ions and catalyzes ring-opening of Z group for cross-linking reaction. And then, a development process is performed to form a quantum dot film layer. The specific steps are as follows.

Figure 2:
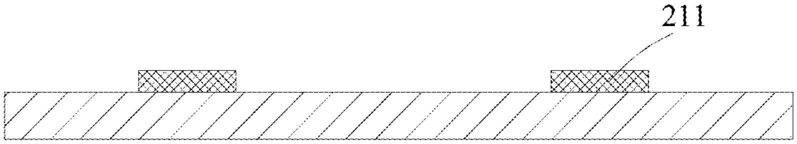
FIG. 2 is a schematic structural diagram of formed green light sub-pixels in some exemplary embodiments of the present disclosure.

As shown in FIGS. 1 to 2, the green quantum dot-ligand solution is coated on a substrate 1 to form a green quantum dot film layer 21. A first photo mask process is applied, and the whole substrate is exposed with ultraviolet light. After exposure, the substrate is heated at 90° C. for 120 s (to promote the complete Boc deprotection reaction). Then one or more mixed solvents of chloroform, toluene, chlorobenzene, tetrahydrofuran, n-hexane, n-heptane, and n-octane are used as a developer for rinsing and developing. After development, the substrate is heated again at 90° C. for 120 s to remove the developer to form green sub-pixels 211.

Figure 3:
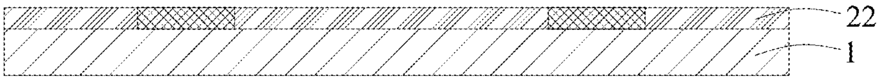
FIG. 3 is a schematic structural diagram of a substrate after coating a blue-quantum dot ligand solution on it in some exemplary embodiments of the present disclosure.
Figure 4:
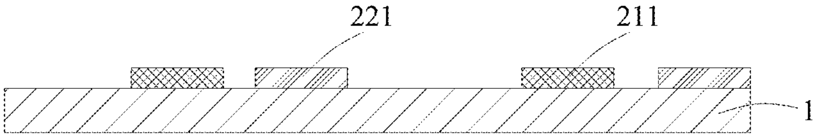
FIG. 4 is a schematic structural diagram of formed blue light sub-pixels in some exemplary embodiments of the present disclosure.

As shown in FIGS. 3 to 4, the blue quantum dot-ligand solution is coated to form a blue quantum dot film layer 22. A second photo mask is applied, and the whole substrate is exposed with ultraviolet light, and then is developed and fixed to form blue light sub-pixels 221.

Figure 5:
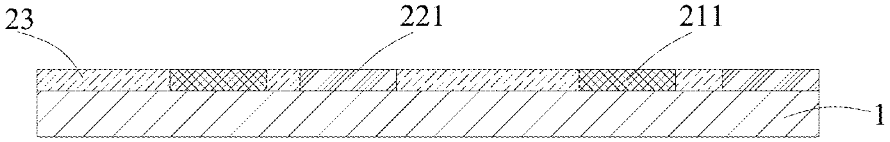
FIG. 5 is a schematic structural diagram of a substrate after coating a red-quantum dot ligand solution on it in some exemplary embodiments of the present disclosure.
Figure 6:
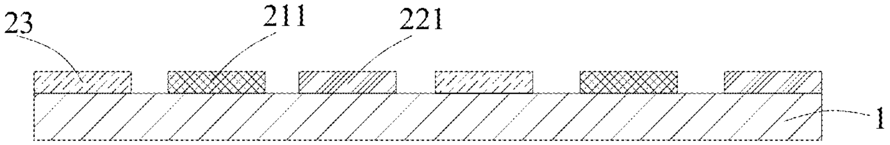
FIG. 6 is a schematic structural diagram of formed red light sub-pixels in some exemplary embodiments of the present disclosure.

As shown in FIGS. 5 to 6, finally, the red quantum dot-ligand solution is coated to form a red quantum dot film layer 23. A third photo mask is applied, and the whole substrate is exposed with ultraviolet light, and then developed and fixed to form red sub-pixels 231.

Taking ligand 1 in Table 1 as an example, the change of a quantum dot after exposure is as follows:

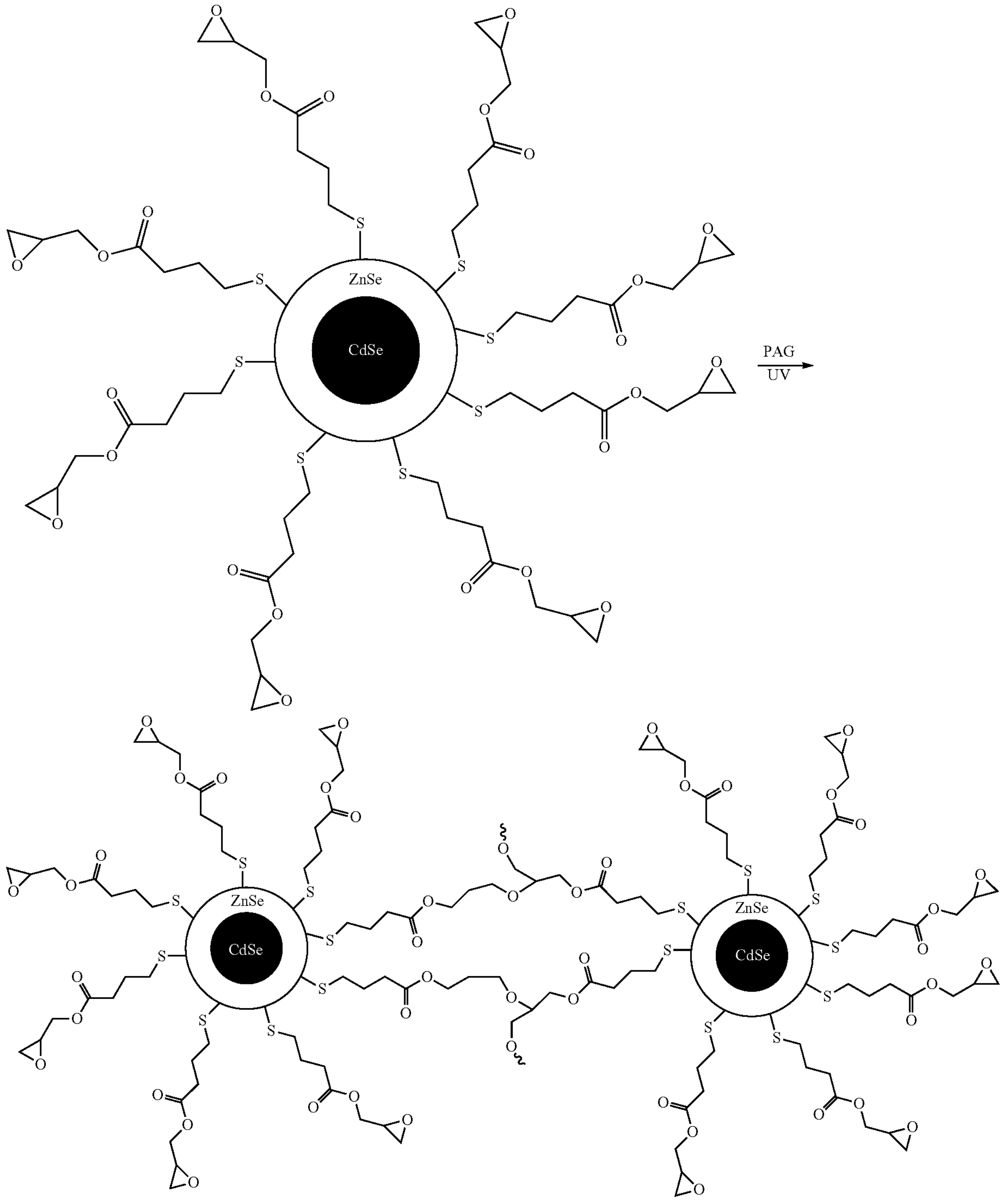

The change of quantum dot after exposure of other ligands can refer to the above contents.

Examples of Preparation for a Display Panel

The display panel includes a quantum dot light emitting device, which includes an anode, a hole injection layer, a hole transport layer, a quantum dot light emitting layer, an electron transport layer, an electron injection layer and a cathode that are stacked in sequence.

The method for preparing the display panel includes the following steps.

The transparent substrate is cleaned by a standard method, and then the following layers are deposited in sequence: grid metal Mo of 200 nm, and being patterned; a gate dielectric $SiO_2$ of 150 nm, and being patterned; an active layer IGZO of 40 nm, and being patterned; source and drain metal Mo of 200 nm, and being patterned; a passivation layer $SiO_2$ of 300 nm, and being patterned; a pixel electrode ITO of 40 nm, and being patterned. Finally, acrylic materials are spin-coated and deposited, and then photolithographed and cured to produce a pixel defining layer of about 1.5 um, to form a TFT backplane.

Before preparing the quantum dot light emitting device (QD-LED), the TFT backplane surface is treated with plasma.

The hole injection layer and the hole transport layer are prepared by a spin coating process, such as spin coating PEDOT (poly 3,4-ethylenedioxythiophene: PSS (polystyrene sulfonic acid) and TFB, etc. The overall thickness is 50-100 nm.

The above photolithography process is adopted to form a quantum dot film layer, specifically including the following steps: coating the green quantum dot-ligand solution, applying the first photo mask, exposing the whole with ultraviolet light, and then developing and fixing to form green sub-pixels; and then coating the blue quantum dot-ligand solution, applying the second photo mask, exposing the whole with ultraviolet light, and then fixing to form blue sub-pixels; finally, coating the red quantum dot-ligand solution, applying a third photo mask, exposing the whole with ultraviolet light, and then developing and fixing to form red sub-pixels.

The electron transport layer and electron injection layer, such as ZnO nano-particles, are formed by spin coating or evaporation.

The cathode metal thin layer can be evaporated. The cathode can be a layer of Al, which is about 500-1000 nm. After the evaporation, it is packaged and cut to complete the preparation of the entire display panel.

The light emitting mode of the AMQLED device can be a bottom light emitting mode. The minimum area of the preparable sub-pixel is 10-30 μm, and the display panel is about 300-800 ppi.

It should be noted that although the various steps of the method in the present disclosure are described in the accompanying drawings in a specific order, this does not require or imply that these steps must be performed in this specific order, or that all the steps shown must be performed to achieve the desired results. Additionally or alternatively, some steps can be omitted, multiple steps can be combined into one step for execution, and/or one step can be decomposed into multiple steps for execution, etc., which should be considered as a part of the disclosure.

It should be understood that the present disclosure does not limit its application to the detailed structure and arrangement of components set forth in this specification. The present disclosure can have other embodiments, and can be implemented and performed in various ways. The foregoing forms of deformation and modification fall within the scope of the present disclosure. It should be understood that the disclosure disclosed and defined in this specification extends to all alternative combinations of two or more individual features mentioned or apparent in the text and/or accompanying drawings. All of these different combinations constitute various alternative aspects of the present disclosure. The embodiments of this specification illustrate the best mode known for realizing the present disclosure, and will enable those skilled in the art to utilize the present disclosure.

What is claimed is:

1. A quantum dot ligand, comprising an X group, a Y group and a Z group, wherein:

the Y group is configured to provide at least two binding sites, among which at least one binding site is configured to bind with the X group and a remaining binding site other than the at least one binding site is configured to bind with the Z group, wherein the Y group comprises at least one binding group selected from alkylene with a carbon atom number ranging from 2 to 12;

the X group is a coordination group configured to form a coordination bond with a surface of a quantum dot, wherein the X group is selected from an amino group, a carboxylic acid group, a sulfydryl, a phosphine group, a phosphine oxide group, or a saturated heterocyclic group containing a disulfide bond; and the Z group is a saturated 3- to 5-membered heterocyclic group containing O or S.

2. The quantum dot ligand according to claim 1, wherein the Z group in the quantum dot ligand is configured to undergo a cross-linking reaction with an adjacent quantum dot ligand by ring-opening under an external action.

3. The quantum dot ligand according to claim 1, wherein the Y group further comprises a carrier transport regulating group bound between the at least one binding group and the Z group.

4. The quantum dot ligand according to claim 3, wherein the carrier transport regulating group is selected from an aniline structure, a triphenylamine structure or a carbazole structure.

5. The quantum dot ligand according to claim 1, wherein the Y group further comprises a dissolving group bound between the at least one binding group and the Z group and selected from a structure containing

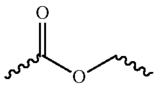 or 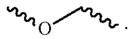.

6. The quantum dot ligand according to claim 1, wherein the Z group is selected from an epoxy group.

7. The quantum dot ligand according to claim 1, wherein the quantum dot ligand is selected from a group consisting of following structures:

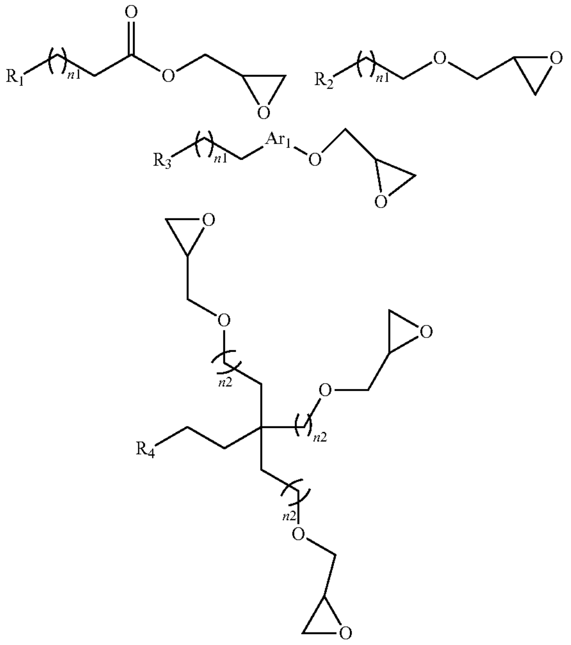

wherein $R_1$, $R_2$, $R_3$ and $R_4$ are each independently selected from an amino group, a carboxylic acid group, a sulfydryl, a phosphine group, a phosphine oxide group, or

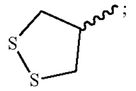

$Ar_1$ is selected from a structure containing phenyleneamido, carbazolyl or

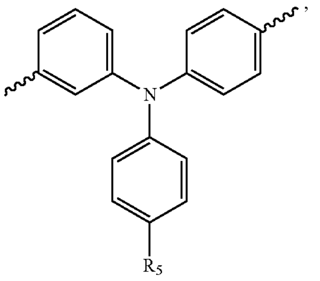

and $R_5$ is selected from

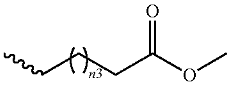

or

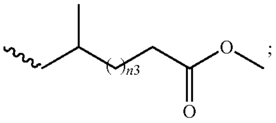

and n1, n2, and n3 are each independently selected from any integer ranging from 2 to 8.

8. The quantum dot ligand according to claim 1, wherein the quantum dot ligand is selected from a group consisting of following structures:

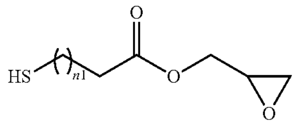

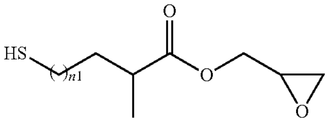

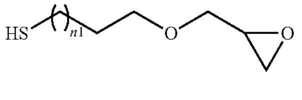

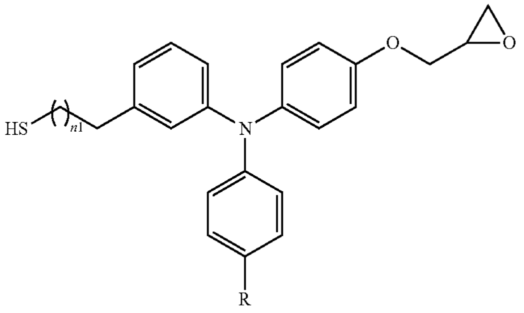

-continued

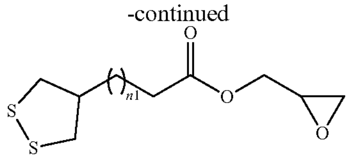

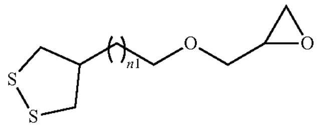

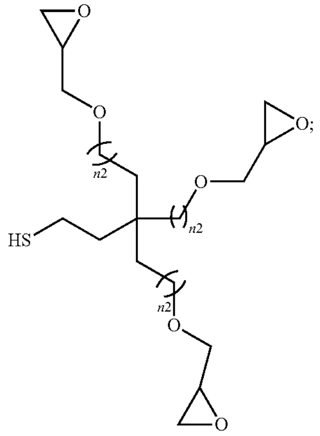

wherein R is selected from

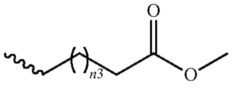

or

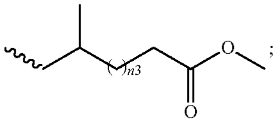

and n1, n2, and n3 are each independently selected from any integer ranging from 2 to 8.

9. A method for preparing a quantum dot film layer, comprising:

providing a quantum dot-ligand solution, wherein the quantum dot-ligand solution is a mixed solution comprising quantum dots, a photo acid generator and quantum dot ligands each according to claim 1;

coating the quantum dot-ligand solution on a substrate and performing an exposure treatment, so that the photo acid generator generates hydrogen ions and catalyzes ring-opening of the Z group for cross-linking reaction; and performing a development process on the substrate to form the quantum dot film layer.

10. A method for preparing a quantum dot light emitting device, comprising:

providing a green quantum dot-ligand solution, wherein the green quantum dot-ligand solution is a mixed solution comprising green quantum dots, a photo acid generator and quantum dot ligands each according to claim 1;

providing a blue quantum dot-ligand solution, wherein the blue quantum dot-ligand solution is a mixed solution comprising blue quantum dots, the photo acid generator and quantum dot ligands each according to claim 1;

providing a red quantum dot-ligand solution, wherein the red quantum dot-ligand solution is a mixed solution comprising red quantum dots, the photo acid generator and quantum dot ligands each according to claim 1;

coating the green quantum dot-ligand solution on a substrate, and performing an exposure and development, to form green sub pixels;

coating the blue quantum dot-ligand solution on the substrate, and performing an exposure and development, to form blue sub pixels; and coating the red quantum dot-ligand solution on the substrate, and performing an exposure and development, to form red sub pixels.

11. A quantum dot-ligand system, comprising a quantum dot, a photo acid generator and a quantum dot ligand, the quantum dot ligand comprising an X group, a Y group and a Z group, wherein:

the Y group is configured to provide at least two binding sites, among which at least one binding site is configured to bind with the X group and a remaining binding site other than the at least one binding site is configured to bind with the Z group, wherein the Y group comprises at least one binding group selected from alkylene with a carbon atom number ranging from 2 to 12;

the X group is a coordination group configured to form a coordination bond with a surface of a quantum dot, wherein the X group is selected from an amino group, a carboxylic acid group, a sulfydryl, a phosphine group, a phosphine oxide group, or a saturated heterocyclic group containing a disulfide bond; and the Z group is a saturated 3- to 5-membered heterocyclic group containing O or S.

12. The quantum dot-ligand system according to claim 11, wherein the photo acid generator is selected from sulfonium and onium salts, triazines, sulfonic esters or diazonium salts.

13. A quantum dot-ligand material, comprising at least two quantum dot-ligand units that comprise a quantum dot and a quantum dot ligand, the quantum dot ligand comprising an X group, a Y group and a Z group, the at least two quantum dot-ligand units being mutually bonded and cross-linked to form a mesh structure through ring-opening of the Z group, wherein:

the Y group is configured to provide at least two binding sites, among which at least one binding site is configured to bind with the X group and a remaining binding site other than the at least one binding site is configured to bind with the Z group, wherein the Y group comprises at least one binding group selected from alkylene with a carbon atom number ranging from 2 to 12;

the X group is a coordination group configured to form a coordination bond with a surface of a quantum dot, wherein the X group is selected from an amino group, a carboxylic acid group, a sulfydryl, a phosphine group, a phosphine oxide group, or a saturated heterocyclic group containing a disulfide bond; and the Z group is a saturated 3- to 5-membered heterocyclic group containing O or S.

14. A quantum dot light emitting device, comprising an anode, a cathode, and a functional layer between the anode and the cathode, the functional layer comprising a quantum dot light emitting layer, the quantum dot light emitting layer comprising the quantum dot-ligand material according to claim 13.

15. The quantum dot light emitting device according to claim 14, wherein, the functional layer further comprises a hole injection layer, a hole transport layer, an electron transport layer and an electron injection layer.

16. A display device, comprising the quantum dot light emitting device according to claim 14.

* * * * *